United States Patent
Pahl

(10) Patent No.: US 7,218,189 B2
(45) Date of Patent: May 15, 2007

(54) SAW COMPONENT WITH ADHESIVE LOCATION AND USE THEREOF

(75) Inventor: Wolfgang Pahl, München (DE)

(73) Assignee: Epcos AG, München (DE)

( * ) Notice: Subject to any disclaimer, the term of this patent is extended or adjusted under 35 U.S.C. 154(b) by 0 days.

(21) Appl. No.: 11/407,708

(22) Filed: Apr. 19, 2006

(65) Prior Publication Data

US 2006/0202781 A1  Sep. 14, 2006

Related U.S. Application Data

(63) Continuation of application No. PCT/EP04/11779, filed on Oct. 18, 2004.

(30) Foreign Application Priority Data

Nov. 4, 2003  (DE)  ................................. 103 51 429

(51) Int. Cl.
  *H03H 9/64* (2006.01)
  *B32B 7/12* (2006.01)
(52) U.S. Cl. .................... 333/193; 428/317.7
(58) Field of Classification Search ................... None
  See application file for complete search history.

(56) References Cited

U.S. PATENT DOCUMENTS 4,494,091 A  1/1985  Goll 6,437,412 B1 *  8/2002  Higuchi et al. ............. 257/416
6,556,105 B1     4/2003  Nguyen
2002/0190605 A1  12/2002  Pahl et al.
2004/0197563 A1 * 10/2004  Kye .......................... 428/413

FOREIGN PATENT DOCUMENTS

| DE | 3729014 A1 | | 3/1989 | |
| JP | 56-152315 | * | 11/1981 | ................. 333/155 |
| JP | 56-152316 | * | 11/1981 | ................. 333/155 |
| JP | 62-141811 | * | 6/1987 | ................. 333/193 |
| JP | 9-153767 | * | 6/1997 | |

OTHER PUBLICATIONS

International Search Report of parent application PCT/EP2004/011779, dated Sep. 12, 2005, pp. 1-3.*
Sidney Lees et al.: "Acoustic Properties of Tungsten-Vinyl Composites", IEEE Transactions on Sonics and Ultrasonics, vol. SU-20, No. 1, Jan. 1973, pp. 1-2.

* cited by examiner

*Primary Examiner*—Barbara Summons
(74) *Attorney, Agent, or Firm*—Mayback & Hoffman, P.A.; Gregory L Mayback

(57) ABSTRACT

The invention is an adhesive, in particular, for components that operate with surface acoustic waves, including a polymer matrix filled with mineral filler particles. The filler is selected from non-conductive or semi-conductive materials and is contained in the adhesive in such a proportion that the total density of the adhesive when cured is greater than 2000 $kg/m^3$.

28 Claims, 1 Drawing Sheet

SAW COMPONENT WITH ADHESIVE LOCATION AND USE THEREOF

CROSS-REFERENCE TO RELATED APPLICATION

This is a continuing application, under 35 U.S.C. § 120, of copending international application No. PCT/EP2004/011779, filed Oct. 18, 2004, which designated the United States; this application also claims the priority, under 35 U.S.C. § 119, of German patent application No. 103 51 429.5, filed Nov. 4, 2003; the prior applications are herewith incorporated by reference in their entirety.

BACKGROUND TO THE INVENTION

FIELD OF THE INVENTION

The invention lies in the field of surface acoustic wave (SAW) components.

Impairments of the signal quality caused by excitation of disturbing bulk waves that are inevitable in the component and that can also develop by conversion of surface acoustic waves take place during operation of electronic components, whose mode of operation is based on transmitting and receiving surface acoustic waves on solid-state bodies.

Particularly, such acoustic bulk waves can be reflected on the rear side of the chip and, thus, again reach the transducer that converts the acoustic wave back into an electric signal. Due to the longer acoustic path, the additional undesired signal portion has a different running time and, thus, tampers with the use signal, which, in an extreme case, can lead to a misinterpretation of a digital signal. At a minimum, such signals lead to an increase of the background noise or to a distortion of the use signal.

It has been proposed to provide the back side of such components with dampening coatings for suppressing interfering acoustic waves. It has also been proposed to roughen or slit the back side to disperse the undesired signal and, thus, make it less damaging.

The dampening coating has the further problem that every dampening film only leads to an incomplete dampening because the impedance difference between component chip and coating inevitably leads to a partial reflection.

It is known to use reaction resins that are filled with metallic particles, particularly with silver, for a dampening coating. However, the disadvantage of such dampening masses is their high electric conductivity that limits their applicability. Already, the conductivity of individual particles interferes, even if the conductivity of the entire mass is low. The careless application of this filled mass on the component chip may lead to undesired short-circuits and, thus, to an impairment of the component function.

Presently, dampening masses with good acoustic adaptation and low or zero electric conductivity are not known. Components with dampening masses that fulfill additional functions for the component are also not known.

SUMMARY OF THE INVENTION

It is accordingly an object of the invention to provide a SAW component with an adhesive location and use of such a component that overcome the hereinbefore-mentioned disadvantages of the heretofore-known devices of this general type and that is suitable for the dampening of acoustic waves and has a plastic mass that is acoustically adapted to a piezo-electric material and also has a zero or low electric conductivity and that fulfills an additional function for the component.

With the foregoing and other objects in view, there is provided, in accordance with the invention, a surface acoustic wave (SAW) component, including a film of an adhesive having a polymer matrix and a filler including one of non-conductive and semiconductive mineral particles in such a proportion that a total density of the adhesive when cured is greater than 2500 kg/m$^3$.

With the objects of the invention in view, there is also provided a surface acoustic wave (SAW) component, including a film of an adhesive having a polymer matrix and a filler including one of non-conductive and semiconductive mineral particles in such a proportion that a total density of the adhesive when cured is between approximately 2,500 kg/m$^3$ and approximately 7,300 kg/m$^3$.

With the objects of the invention in view, there is also provided a surface acoustic wave (SAW) component, including a film of an adhesive having a polymer matrix and a filler including particles to have a total density of the adhesive when cured to be between approximately 2,500 kg/m$^3$ and approximately 7,300 kg/m$^3$.

In accordance with another feature of the invention, the mineral particles are selected from the group consisting of silicon carbide, titanium oxide, aluminum oxide, zinc sulfide, $ZrO_2$, $BaSO_4$, and $WO_3$.

In accordance with a further feature of the invention, the polymer matrix is a polymer matrix selected from the group consisting of epoxy resin, siloxane-caoutchouc, acrylate, polyurethane, and polyimide.

In accordance with an added feature of the invention, the adhesive is a two-component reaction resin system with a resin component and a curing component and the filler is included in at least one of the components.

In accordance with an additional feature of the invention, the adhesive further includes a photo-initiator.

In accordance with yet another feature of the invention, there is provided a shaped body and a component body glued to the shaped body at an adhesive location by the adhesive.

In accordance with yet a further feature of the invention, there is provided a mechanically stable support glued to the component body.

In accordance with yet an added feature of the invention, the component body has a main top surface free of active component structures and the component body is a chip of a piezo-electric material and the shaped body glued to the main top surface.

In accordance with yet an additional feature of the invention, the film of the adhesive dampens surface acoustic waves.

In accordance with again another feature of the invention, a total density of the adhesive when cured is between approximately 2,500 kg/m$^3$ and approximately 3,000 kg/m$^3$.

In accordance with again a further feature of the invention, a total density of the adhesive when cured is between approximately 2,500 kg/m$^3$ and approximately 4,000 kg/m$^3$.

In accordance with again an added feature of the invention, a total density of the adhesive when cured is between approximately 3,000 kg/m$^3$ and approximately 4,000 kg/m$^3$.

In accordance with again an additional feature of the invention, a total density of the adhesive when cured is between approximately 3,000 kg/m$^3$ and approximately 7,300 kg/m$^3$.

In accordance with still another feature of the invention, a total density of the adhesive when cured is between approximately 4,000 kg/m$^3$ and approximately 7,300 kg/m$^3$.

In accordance with a concomitant feature of the invention, the component is a SAW component used for a multimedia application.

Other features that are considered as characteristic for the invention are set forth in the appended claims.

Although the invention is illustrated and described herein as embodied in a SAW component with an adhesive location and use of such a component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
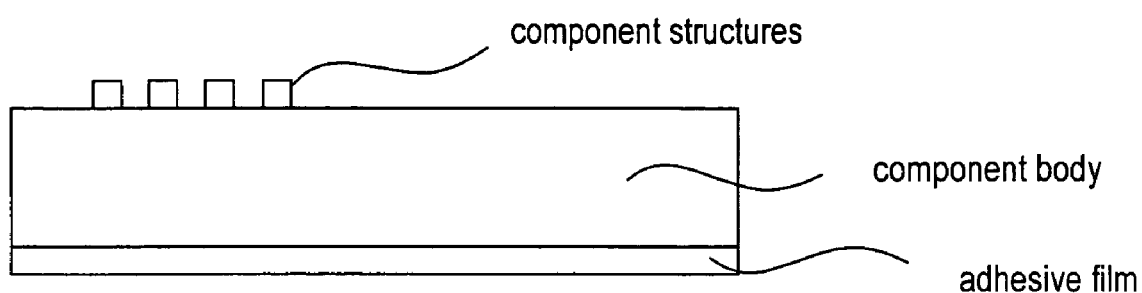
FIG. 1 is a fragmentary, diagrammatic, cross-sectional view of an exemplary embodiment of a component body according to the invention.

The present invention proposes a component with an adhesive having a polymer matrix that is filled with a filler, whereby non-conductive or semi-conductive mineral particles are contained in a portion sufficiently high enough so that the total density of the adhesive in its cured state is more than 2500 $kg/m^3$.

In the component, the adhesive film has an acoustic impedance that is well-adapted to piezo-electric materials, such as, for example, quartz, lithium niobate, or lithium tantalate. Thus, the adhesive film fulfills the double function of sticking together components operating with acoustic waves as well as dampening interfering acoustic bulk waves or surface acoustic waves. The dampening of bulk waves is facilitated in that the reflection at the interface of piezo-electric component bodies into the adhesive film is reduced.

An adhesive with the desired density can be obtained when the mineral particles are selected from silicon carbide, titanium oxide, aluminum oxide, zinc sulfate, zirconium oxide, barium sulfate, and tungsten trioxide. These particles have densities of between 3,000 and 7,300 $kg/m^3$. Advantageously, the particles are selected from zinc sulfide, zirconium oxide, barium sulfate, and tungsten trioxide, each having a density of above 4,000 $kg/m^3$. Depending on the selection of the filler, a desired density with different portions of filler or mineral particles, respectively, can be reached. When the entire density is constant, a small portion of mineral particles with higher density leads to an increased portion of polymer matrix and, consequently, to an improved adhesive reaction. With a constant portion of mineral particles, the selection of a filler with a high density leads to an adhesive with a higher total density that is even better adapted to piezo-electric materials, as they are used in components that operate with acoustic waves.

The polymer matrix for the adhesive used in the component according to the invention is selected from arbitrary reaction resins and curing masses that can, on one hand, be processed with a filler and, on the other hand, are suitable as an adhesive. The polymer matrix can, for example, include epoxy resin, siloxane caoutchouc (silicone), acrylate, polyurethane, or polyimide. In the not yet cured adhesive, the basic materials for the polymer matrix are present in a low-molecular to oligomeric form that can be cured to a firm molded material. Adhesives according to the invention also include monomeric compounds that can be cured to polymers by a corresponding curing reaction.

Preferably, an adhesive according to the invention is embodied as a two-component reaction resin system that includes a resin component and a curing component. Such a two-component reaction resin system is mixed together immediately prior to being used, because the mixture of the two components can only be stored for a limited amount of time, while the individual components can be stored for many months without losing chemical activity that causes the curability. Usually, the mixing of the individual components to a readily usable adhesive takes place at the adhesive manufacturer, who, then, immediately freezes the mixture to slow down or prevent further curing.

Preferably, an adhesive used according to the invention contains a photo-initiator that creates a chemically reactive starter connection in the adhesive that supports the further thermal curing. With such a photo-initiator, it is possible to activate an adhesive according to the invention by light irradiation or UV irradiation and to, thus, facilitate curing. Such a photo-initiation is, commonly, not suitable for depth curing because the depth curing commonly takes place purely thermally. Contrary thereto, in the absence of light, the adhesive can be stored well, without inadmissible increases in viscosity.

Regardless of the high filler portion of the adhesives that are used according to the invention, a curing by light or UV is easily possible for thinly applied adhesive films.

The component according to the invention has adhesive location at which the component body is glued together with a shaped body. The adhesive used according to the invention is always advantageous if a high density and the chemical/physical characteristics connected therewith are desired, for example, a high heat conductivity or the said acoustic impedance adapted to piezoelectric material that, as compared to an unfilled adhesive or an adhesive filled with common filler, is increased and the acoustic adaptation is, thus, improved.

In an embodiment of the invention, the adhesive is equipped with a low electric conductivity, which is achieved by selecting a filler with a correspondingly low electric conductivity. Such an adhesive has an advantage in that it can lead away loads of static electricity that are undesired in connection with piezoelectric or pyroelectric component bodies that, due to the pyroelectric effect, can arise in the component body.

Figure 2:
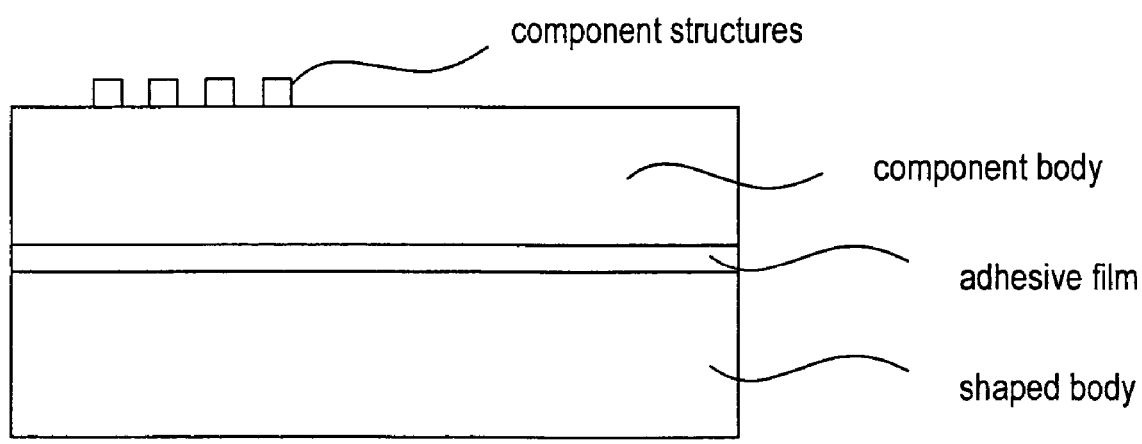
FIG. 2 is a fragmentary, diagrammatic, cross-sectional view of another exemplary embodiment of a component body according to the invention.

As shown, for example, in FIGS. 1 and 2, a component according to the invention, whose component body operates with acoustic waves if advantageous, whereby the component body with its main top surface that is free of active component structures, is glued to a mechanically stable support. For example, such a support is a leadframe or a printed circuit board of a ceramic material or plastic. Such a printed circuit board can be adapted to the size of the component body and form, for example, part of the component housing. The printed circuit board or the substrate, however, can also have a larger surface and can represent, for example, a module substrate to which the component body is glued. Electric conductor tracks can be present in contact with the adhesive location because the good dielectric characteristics of the adhesive prevent a short-circuit. The component body, however, can also be glued to a further component body.

Preferably, SAW components that are used for applications in multimedia are glued with the adhesive according to the invention. Multimedia applications require a signal transmission with a particularly low level of interferences.

However, with the component according to the invention, it is also possible to not only apply the adhesive on the rear side of the component body operating with acoustic waves and use it there in the form of an adhesive location for adhesion with a shaped body or a support or a substrate, it is also possible, for example, to apply the adhesive on that side of the component body carrying the component structures. If this takes place in regions outside of the acoustic track, the dampening of such surface waves that have left the acoustic track (for example, due to dispersion and undesired diagonal reflection) succeeds. A dampening of such wave portions that have left the acoustic track also prevents the reflection of these wave portions at adjacent structures or at edges of the component body. As a consequence of such reflection, such wave portions can be reflected back into the acoustic track and, there, also cause undesired signal portions. In such an application, the adhesive is not necessarily used for adhesion, but can also serve as a coating. The adhesive is also suitable for the outer sealing of the joint between chip and substrate in components bonded by flip-chip technology. If the adhesive according to the invention is used as an underfiller it can serve simultaneously as an acoustic dampening mass for surface waves.

Preferably, the adhesive is applied by screen printing, because, regardless of the high density, it has a relatively small portion of filler that is caused by the high specific density of the mineral material. Due to its small portion of filler, the adhesive can be equipped with a viscosity that is suitable for processing in screen printing technology. The application of adhesive on adhesive locations by screen printing has an advantage—it can be carried out in a particularly even film thickness. However, it is also possible to apply the adhesive with other methods, for example, by dripping or coating. Stamp printing is also suitable for the application of the adhesive.

The curing speed and the required curing conditions can be adjusted in an adhesive used according to the invention by the chemistry of the polymer matrix, particularly, the ratio of resin component to curing component, by the portion of photo-initiator, and by the reactivity of the groups that are suitable for a curing reaction. Preferably, the adhesive is adjusted so that common curing methods can be used at moderate temperatures that cannot exercise thermal influences that are damaging for items on the component.

It lies within the scope of the invention to further vary chemistry and fillers and to use them in adhesives according to the invention. Preferred particle sizes for the mineral filler are dependent on the type of use, but are, preferably, selected as small as possible. It is also advantageous to maintain a grain size distribution of the mineral filler that enables the densest possible packaging of the filler in the polymer matrix. Such filler distributions for optimal packaging density are known per se.

I claim:

1. A surface acoustic wave (SAW) component, comprising:
    a film of an adhesive having:
        a polymer matrix; and
        a filler including one of non-conductive and semiconductive mineral particles in such a proportion that a total density of said adhesive when cured is greater than 2500 kg/m$^3$.
2. The component according to claim 1, wherein said mineral particles are selected from the group consisting of silicon carbide, titanium oxide, aluminum oxide, zinc sulfide, $ZrO_2$, $BaSO_4$, and $WO_3$.
3. The component according to claim 1, wherein said polymer matrix is a polymer matrix selected from the group consisting of epoxy resin, siloxane-caoutchouc, acrylate, polyurethane, and polyimide.
4. The component according to claim 1, wherein:
    said adhesive is a two-component reaction resin system with a resin component and a curing component; and
    said filler is included in at least one of said components.
5. The component according to claim 2, wherein:
    said adhesive is a two-component reaction resin system with a resin component and a curing component; and
    said filler is included in at least one of said components.
6. The component according to claim 3, wherein:
    said adhesive is a two-component reaction resin system with a resin component and a curing component; and
    said filler is included in at least one of said components.
7. The component according to claim 1, wherein:
    said adhesive is a two-component reaction resin system with a resin component and a curing component; and
    said filler is included in one or both of said components.
8. The component according to claim 1, wherein said adhesive further comprises a photo-initiator.
9. The component according to claim 1, further comprising:
    a shaped body; and
    a component body glued to said shaped body at an adhesive location by said adhesive.
10. The component according to claim 9, further comprising
    a mechanically stable support glued to said component body.
11. The component according to claim 9, wherein:
    said component body has a main top surface free of active component element structures; and
    said component body is a chip of a piezo-electric material and said shaped body glued to said main top surface.
12. The component according to claim 1, wherein said film of said adhesive dampens surface acoustic waves.
13. The component according to claim 1, wherein said component is a SAW component used for a multimedia application.
14. A surface acoustic wave (SAW) component, comprising:
    a film of an adhesive having:
        a polymer matrix; and
        a filler including one of non-conductive and semiconductive mineral particles in such a proportion that a total density of said adhesive when cured is between approximately 2,500 kg/m$^3$ and approximately 7,300 kg/m$^3$.
15. The component according to claim 14, wherein a total density of said adhesive when cured is between approximately 2,500 kg/m$^3$ and approximately 3,000 kg/m$^3$.
16. The component according to claim 14, wherein a total density of said adhesive when cured is between approximately 2,500 kg/m$^3$ and approximately 4,000 kg/m$^3$.
17. The component according to claim 14, wherein a total density of said adhesive when cured is between approximately 3,000 kg/m$^3$ and approximately 4,000 kg/m$^3$.

18. The component according to claim 14, wherein a total density of said adhesive when cured is between approximately 3,000 kg/m$^3$ and approximately 7,300 kg/m$^3$.

19. The component according to claim 14, wherein a total density of said adhesive when cured is between approximately 4,000 kg/m$^3$ and approximately 7,300 kg/m$^3$.

20. The component according to claim 14, wherein:
said mineral particles are selected from the group consisting of silicon carbide, titanium oxide, aluminum oxide, zinc sulfide, $ZrO_2$, $BaSO_4$, and $WO_3$; and
said polymer matrix is a polymer matrix selected from the group consisting of epoxy resin, siloxane-caoutchouc, acrylate, polyurethane, and polyimide.

21. The component according to claim 14, wherein:
said adhesive is a two-component reaction resin system with a resin component and a curing component; and
said filler is included in at least one of said components.

22. The component according to claim 14, wherein said adhesive further comprises a photo-initiator.

23. The component according to claim 14, further comprising:
a shaped body; and
a component body glued to said shaped body at an adhesive location by said adhesive.

24. The component according to claim 23, further comprising a mechanically stable support glued to said component body.

25. The component according to claim 23, wherein:
said shaped body has a main top surface free of active component element structures; and
said component body is a chip of a piezo-electric material glued to said main top surface.

26. The component according to claim 14, wherein said film of said adhesive dampens surface acoustic waves.

27. A surface acoustic wave (SAW) component, comprising:
a film of an adhesive having:
a polymer matrix; and
a filler including particles to have a total density of said adhesive when cured to be between approximately 2,500 kg/m$^3$ and approximately 7,300 kg/m$^3$.

28. The component according to claim 27, wherein said particles are non-conductive or semiconductive mineral particles.

* * * * *